(12) United States Patent
Chien et al.

(10) Patent No.: US 9,159,559 B2
(45) Date of Patent: Oct. 13, 2015

(54) LITHOGRAPHY LAYER WITH QUENCHERS TO PREVENT PATTERN COLLAPSE

(71) Applicant: TAIWAN SEMICONDUCTOR MANUFACTURING COMPANY, LTD., Hsin-Chu (TW)

(72) Inventors: Shang-Chieh Chien, New Taipei (TW); Shu-Hao Chang, Taipei (TW); Jui-Ching Wu, Hsinchu (TW); Jeng-Horng Chen, Hsinchu (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 19 days.

(21) Appl. No.: 13/945,523

(22) Filed: Jul. 18, 2013

(65) Prior Publication Data

US 2014/0256146 A1    Sep. 11, 2014

Related U.S. Application Data

(60) Provisional application No. 61/793,015, filed on Mar. 15, 2013, provisional application No. 61/776,651, filed on Mar. 11, 2013.

(51) Int. Cl.
*H01L 21/308* (2006.01)
*H01L 21/027* (2006.01)
*H01L 21/033* (2006.01)

(52) U.S. Cl.
CPC ........ *H01L 21/0276* (2013.01); *H01L 21/0337* (2013.01); *H01L 21/308* (2013.01); *H01L 21/3081* (2013.01); *H01L 21/3085* (2013.01); *H01L 21/3086* (2013.01)

(58) Field of Classification Search
CPC .............. H01L 21/308; H01L 21/3081; H01L 21/3085; H01L 21/3086; H01L 21/0337
USPC ........................................ 438/703; 430/270.1
See application file for complete search history.

(56) References Cited

U.S. PATENT DOCUMENTS

| | | | |
|---|---|---|---|
| 6,703,323 B2 | 3/2004 | Kong et al. | |
| 7,070,832 B2 | 7/2006 | Goldstein | |
| 8,802,354 B2 | 8/2014 | Chang | |
| 2004/0072108 A1 | 4/2004 | Hyon | |
| 2005/0054216 A1* | 3/2005 | Daley | 438/781 |
| 2005/0112497 A1* | 5/2005 | Jung | 430/270.1 |
| 2007/0172759 A1* | 7/2007 | Ogihara et al. | 430/270.1 |
| 2009/0148789 A1* | 6/2009 | Amara et al. | 430/270.1 |

(Continued)

OTHER PUBLICATIONS

Guen-Ho Hwang et al., "Patterning Capability and Limitations by Patter Collapse in 45nm and Below Node Photo Mask Production," Proc. of SPIE vol. 7028, 702824-1, 10 pages.

(Continued)

*Primary Examiner* — Peter Bradford
(74) *Attorney, Agent, or Firm* — Haynes and Boone, LLP

(57) ABSTRACT

The present disclosure provides a method for forming resist patterns. The method includes providing a substrate; forming a material layer including a plurality of quenchers on the substrate; forming a resist layer on the material layer; exposing the resist layer; and developing the resist layer to form a structure featuring resist remaining layer on an upper surface of the material layer, and a plurality of resist features on the resist remaining layer to improve the yield of lithography process.

19 Claims, 4 Drawing Sheets

(56) References Cited

U.S. PATENT DOCUMENTS

2010/0119972 A1* 5/2010 Houlihan et al. .......... 430/281.1
2010/0213580 A1* 8/2010 Meador et al. ................ 257/629
2011/0097670 A1 4/2011 Wang et al.
2015/0017808 A1* 1/2015 Koh ............................ 438/703

OTHER PUBLICATIONS

Ching-Yu Chang, U.S. Appl. No. 13/486,697, filed Jun. 1, 2012, "Photosensitive Material and Method of Lithography," 26 pages of text, 4 pages of drawings.

* cited by examiner

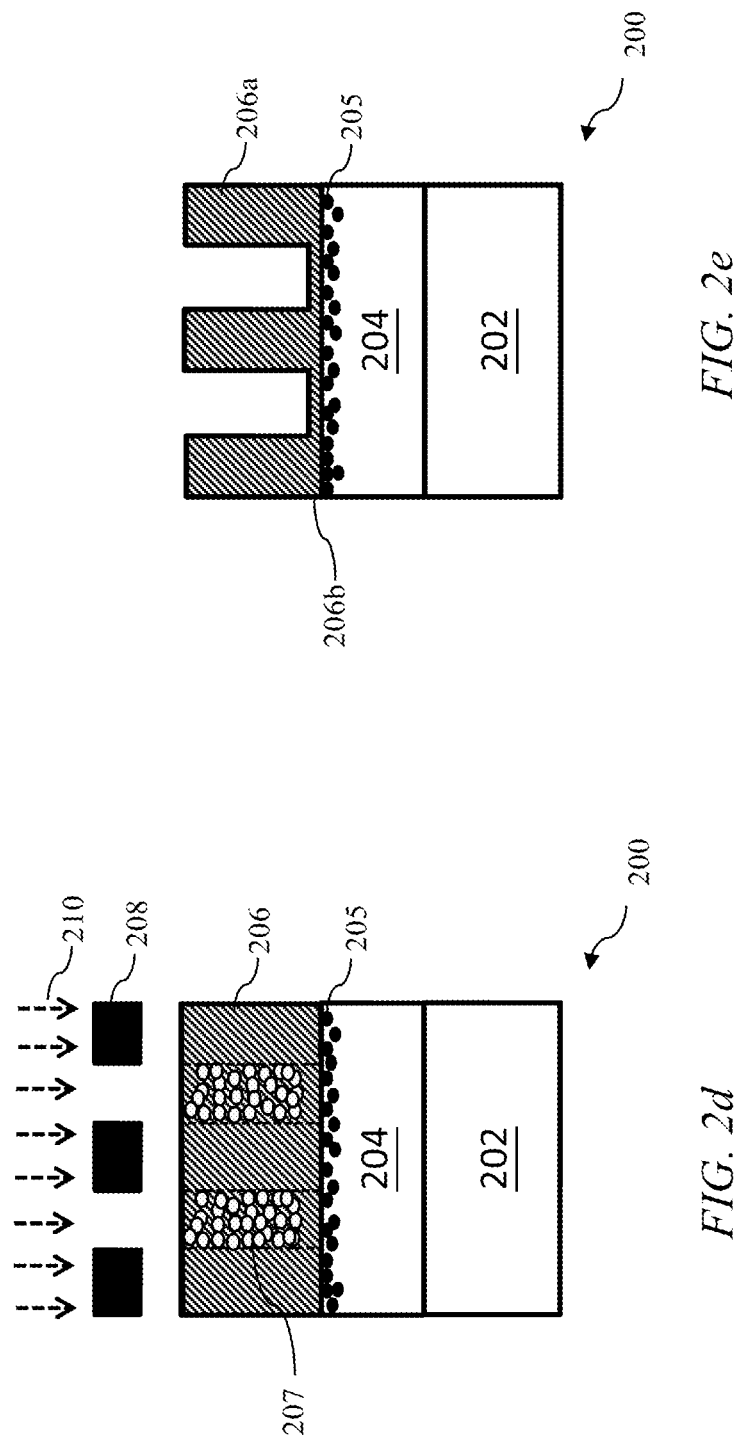

LITHOGRAPHY LAYER WITH QUENCHERS TO PREVENT PATTERN COLLAPSE

CROSS REFERENCE

This application claims the benefit of U.S. Provisional Application No. 61/793,015 entitled "Method and Structure to Improve Process Window for Lithography" filed Mar. 15, 2013, and U.S. Provisional Application No. 61/776,651 entitled "Method of Preventing Pattern Collapse" filed Mar. 11, 2013, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

As the critical dimension (CD) of a feature is scaled down, the feature may have a high aspect ratio (the ratio of the height vs. width of the feature). When the high aspect ratio reaches a critical value, the pattern may actually collapse or fall down during the fabrication process. Generally speaking, the pattern collapse often occurred in wet developing process. For example, the pattern collapse may occur when rinsing with Deionized (DI) water and spin-drying with high speed rotation.

Accordingly, there is a need for a method for preventing the pattern collapse from occurring.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 2a through 2e illustrate sectional views of semiconductor device having a material layer and a resist layer at various fabrication steps of a lithography process in one embodiment constructed according to some aspects of the present disclosure.

DETAILED DESCRIPTION

Figure 1C:
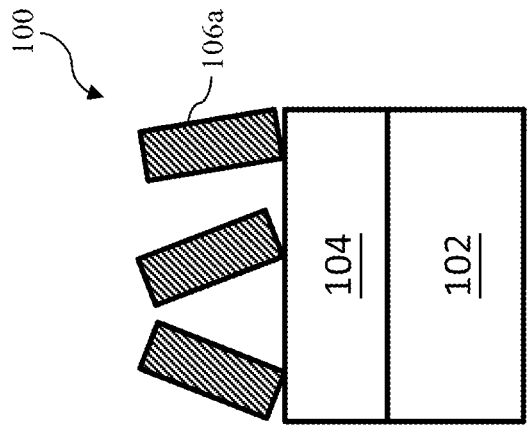
FIGS. 1a through 1c illustrate sectional views of one exemplary semiconductor device having a resist layer being exposed during a lithography process.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1B:
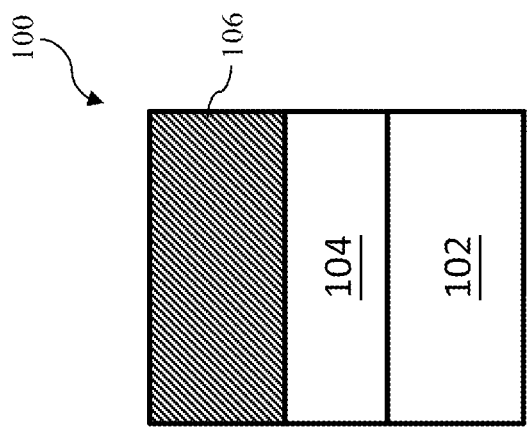
Figure 1A:
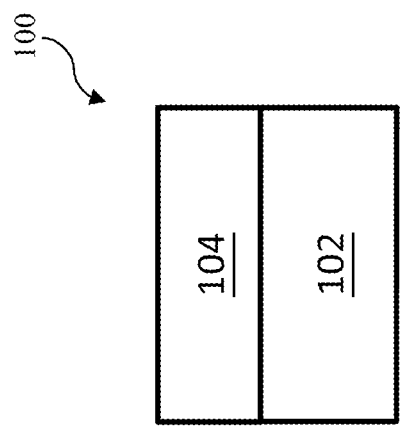

FIGS. 1a through 1c provide sectional views of a semiconductor device 100 at various steps during a lithography process. In one embodiment, a material layer 104, for example an anti-reflective layer, is formed on a substrate 102 as illustrated in FIG. 1a. A photoresist layer 106 is formed on the material layer 104 as illustrated in FIG. 1b. In one embodiment, the photoresist layer 106 is selectively exposed to ultraviolet (UV), deep ultraviolet (DUV), extreme ultraviolet light (EUV) or even electron beam (EB) through a reticle. The photoresist layer 106 is then developed using a chemical developer to form a photoresist pattern on the material layer 104. In one embodiment, the photoresist pattern is further treated with deionized (DI) water rinsing process and a spin drying process with high speed rotation.

As the critical dimension (CD) of a photoresist feature is scaled down, the aspect ratio of the photoresist feature may increase. When the photoresist pattern is formed during developing process, the capillary attraction force between photoresist features increases as the aspect ratio increases. The capillary attraction force may also increase during the rinsing and spin drying process after the developing process. When the capillary attraction force becomes larger than the adhesion force between the photoresist feature and the material layer 104, pattern collapse 106a may occur, as illustrated in FIG. 1c.

FIGS. 2a through 2e provide sectional views of a semiconductor device 200 at various steps during a lithography process. In one embodiment, the semiconductor device 200 includes a substrate 202. The substrate 202 may be a semiconductor substrate including silicon. Alternatively the substrate 202 may include germanium, silicon germanium or other suitable semiconductor materials, such as diamond, silicon carbide or gallium arsenic. The substrate 202 may further include additional features and/or material layers, such as various isolation features formed in the substrate. The substrate 202 may include various doped regions, such as p-type doped regions and/or n-type doped regions configured and coupled to form various devices and functional features. All doping features may be achieved using a suitable process, such as ion implantation in various steps and techniques. The substrate 202 may include other features, such as shallow trench isolation (STI). The substrate 202 may further include various material layers, such as gate material layers. In some examples, the substrate 202 is the substrate 102, Before forming a material layer 204, the substrate 202 may be treated with cleaning, dehydrating and/or surface priming processes, so that the surface of the substrate 202 has a good adhesion between the material layer 204 and the substrate 202. In some examples, the cleaning process may include wet cleaning and/or DI water rinsing to remove contaminants. Dehydrating process may be done in a closed chamber to remove adsorbed water on the surface of the substrate 202. The substrate may be primed with chemicals, such as hexamethyldisilazane (HMDS), to improve adhesion between the material layer 204 and the surface of the substrate 202.

Figure 2C:
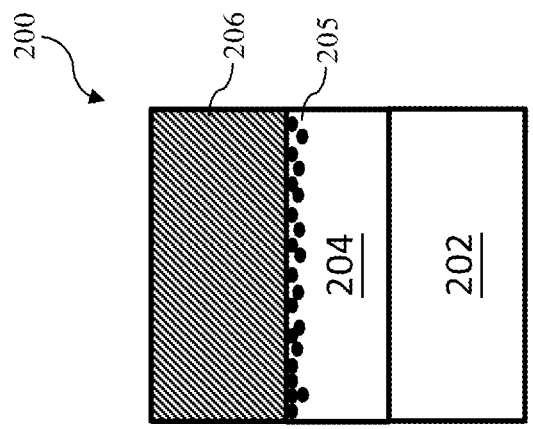
Figure 2B:
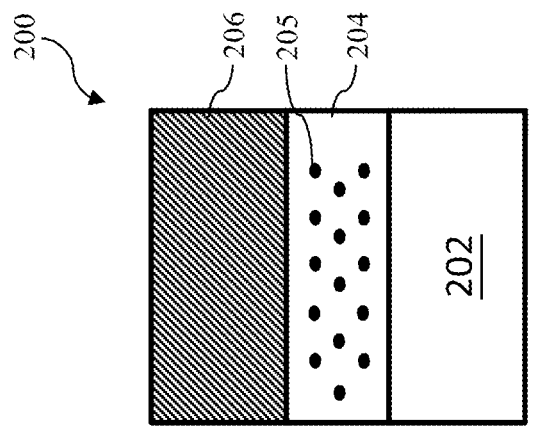
Figure 2A:
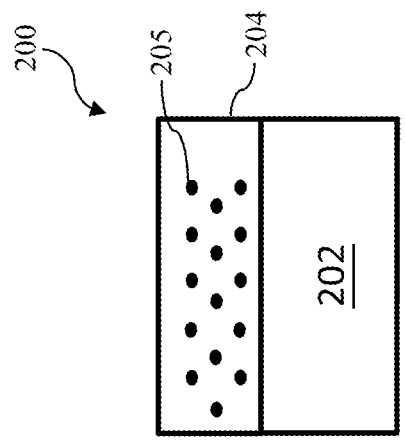

As illustrated in FIG. 2a according to an embodiment, a material layer 204 is disposed on the substrate 202. For example, a spin coating technique is utilized to form the material layer 204 on the substrate. In one embodiment, the material layer 204 includes an anti-reflective material configured to suppress unintended light reflection during lithography process. In some examples, the material layer 204 may include an organic anti-reflective material. In some examples, the material layer 204 may include a bottom anti-reflective coating (BARC) material.

In some embodiments, before the spin coating process, a plurality of quenchers or base materials are added into the spin coating solution. In one embodiment as illustrated in FIG. 2a, after the spin coating process, the plurality of quenchers or base materials 205 are distributed in the material layer 204. In one example, the quenchers or base materials 205 are capable of neutralizing acid. In some embodiments, the plurality of quenchers or base materials 205 may be uniformly distributed in the material layer 204. In some embodiments, the plurality of quenchers or base materials 205 may not be uniformly distributed in the material layer 204.

In some embodiments, the quenchers include base materials that may substantially neutralize the acid. The plurality of quenchers or base molecules may have the formula: $N(R)_3$, where R includes an alkyl functional structure having at least one carbon atom. In one embodiment, at least one of the R groups includes a —$CH_3$ group. In one embodiment, each of the R groups may further includes one or more chemical groups selected from the —Cl; —Br; —I; —$NO_2$; —$SO_3$-; —H—; —CN; —NCO; —OCN; —$CO_2$-; —OH; —OR*, —OC(O)CR*; —SR, —$SO_2N(R^*)_2$; —$SO_2R^*$; SOR; —OC(O)R*; —C(O)OR*; —C(O)R*; —Si(OR*)3; —Si(R*)3; and/or epoxyl groups. R* may be H, an unbranched or branched, cyclic or noncyclic, saturated or unsaturated alkyl or alkenyl or alkynyl groups. Further examples of quenchers or base materials are provided in U.S. Patent Application 2011/0097670 and U.S. patent application Ser. No. 13/486,697, which are hereby incorporated by reference.

Still referring to FIG. 2a, after the spin coating process, a baking process may be conducted to evaporate the solvent in the material layer 204. In some embodiments, the quenchers or base materials 205 may migrate into the upper portion of the material layer 204 during and/or after the baking process. In one embodiment, the baking process is conducted at a temperature ranging from about 30° C. to about 300° C. The baking process may be performed for about 0.5 minutes to 300 minutes.

Referring to FIG. 2b, a resist layer 206 is disposed on the material layer 204. In some embodiments, the resist layer 206 includes a photosensitive layer. In some embodiments, the resist layer 206 includes an electron beam sensitive layer. In some examples, the resist layer 206 may be formed on the material layer 204 using a spin coating technique. In some examples, the resist layer 206 has a thickness ranging from about 5 nm to about 300 nm. In some examples, the resist layer 206 is the resist layer 106.

Referring to FIG. 2c, in one embodiment, after the resist layer 206 is formed on the material layer 204, a baking process may be conducted to evaporate the solvent in the resist layer 206. For example, the baking process is a soft-baking process. In some examples, the quenchers or base materials 205 are designed to enhance the surface energy difference and/or phase separation, such that the quenchers or base materials 205 can migrate into the upper portion of the material layer 204 during and/or after the baking process. There are one or more factors associated with the surface energy difference and/or phase separation. In various embodiments, these factors may include molecular weight difference, polarity difference, hydrophilic/hydrophobic difference, solubility difference to solvent, and/or polymer solubility, etc.

In some examples, the quenchers or base molecules may have a lower molecular weight than other materials in the material layer 204, so that the quenchers or base molecules can migrate into the upper portion of the material layer 204 during and/or after the baking process.

In some examples, the quenchers or base molecules may have a different polarity from those of other materials in the material layer, so that the quenchers or base molecules can migrate into the upper portion of the material layer 204 during and/or after the baking process. The material layer may include an anti-reflective material. For example, if the anti-reflective material is more non-polar compared to the quenchers, the base molecules or quenchers may migrate to the upper surface during and/or after the baking process.

In some examples, the base molecules or quenchers may have a different hydrophilic/hydrophobic property compared to those of other materials in the material layer. The material layer may include an anti-reflective material. For example, the anti-reflective material may be aqueous-based. The quenchers or base molecules may be hydrophobic. During and/or after the soft-baking process, the quenchers or base molecules may separate from the anti-reflective material. The quenchers or base molecules may also migrate into the upper portion of the material layer 204.

In some examples, the quenchers or base molecules may have a higher solubility to the solvent than those of other materials in the material layer. Thus the quenchers or base molecules can migrate into the upper portion of the material layer 204 during and/or after the baking process.

In some examples, the quenchers and other materials in the material layer may have different hydrogen bonding and/or Vander Waal forces, thus it may cause separation during the baking process. Although the one or more factors associated with the surface energy difference and/or phase separation are discussed separately as above, a person having ordinary skill in the art would be able to understand that the quenchers may be designed to contain one factor, or multiple factors combined.

Still referring to FIG. 2c, in one embodiment, during and/or after the baking process, the plurality of quenchers or base materials 205 in the material layer 204 migrate into an upper portion of the material layer 204. In one embodiment, the plurality of quenchers or base materials 205 may be uniformly distributed in the material layer 204 during and/or after the baking process. In one embodiment, the plurality of quenchers or base materials 205 may not be uniformly distributed in the material layer 204 during and/or after the baking process. For example, the concentration of the quenchers or base materials 205 in the upper portion is higher than the concentration of the quenchers or base materials in the lower portion of the material layer 204. In one embodiment, the baking temperature is in the range of 30-300° C. In one particular embodiment, the baking process is conducted at a temperature ranging from about 200° C. to about 250° C. In one embodiment, the baking process is performed for about 0.5 minutes to 300 minutes.

The material layer 204 may include one or more layers. In some examples, the material layer 204 includes a base quencher layer. The base quencher layer is capable of neutralizing acid.

Referring to FIG. 2d, the semiconductor device 200 is exposed to a radiation 210. In one embodiment, the semiconductor device 200 may be selectively exposed to the radiation using a reticle 208. In one embodiment, the resist layer 206 may be a positive photoresist. Before exposing to the radiation 210, the positive resist layer 206 is insoluble to developer chemical. After exposing the positive resist layer 206 using a reticle 208 to the radiation 210, such as UV light, the regions exposed to the radiation 210 become soluble to the developer chemical. In another embodiment, the resist layer 206 may be a negative photoresist. Before exposed to a radiation, the negative photoresist layer 206 is soluble to developer chemical. After exposing the negative resist layer 206 to the radiation 210, the exposed regions become insoluble to the developer chemical.

Still referring to FIG. 2d, in some embodiments, resist layer 206 may include a chemical amplification (CA) resist material. The CA resist material may substantially increase the sensitivity of the resist layer to the radiation. The CA resist material includes a chemical protecting group that makes the resist layer insoluble in the developer chemical. In one embodiment, the resist layer 206 also includes photo-acid generator (PAG) material. PAG material is sensitive to a radiation, such as UV light and secondary electron. In one embodiment, PAG material produces an acid 207 upon exposure to a radiation 210, such as UV, DUV, EUV light or E-Beam. The acid 207 may be only generated in the regions exposed to the radiation 210 as illustrated in FIG. 2d. In the regions where there is no radiation exposure, the acid is not generated. The acid 207 generated by PAG molecules may remove the protecting groups in the CA resist material. In one embodiment, the acid 207 generated upon exposure to a certain dose of radiation 210 may remove the protecting groups in the exposed regions so that the CA resist material in the exposed regions becomes soluble to the developer chemical. The removal of the protecting groups in CA resist material may occur during a baking process, for example a post-exposure baking (PEB) process. Examples of PAG material are provided in U.S. patent application Ser. No. 13/486,697, which is hereby incorporated by reference.

In some embodiments, after exposure to a radiation, the semiconductor device 200 is performed a baking process. In one embodiment, the baking process is a post-exposure baking process. In one embodiment as illustrated in FIG. 2d, during and/or after the baking process, the plurality of quenchers or base materials 205 are distributed in an upper portion of the material layer 204. In one embodiment, the quenchers or base materials 205 may neutralize the acid 207 generated in the resist layer 206. In one embodiment, the quenchers or base materials 205 may neutralize the acid distributed in a lower portion of the resist layer 206. In one embodiment, the quenchers or base materials 205 may neutralize the acid distributed at the interface between the material layer 204 and the resist layer 206.

Referring to FIG. 2e, the semiconductor device 200 is developed in a developer chemical to form resist patterns. In one embodiment, the developer chemical is a basic chemical. For example, the developer chemical is tetramethyl ammonium hydroxide (TMAH) solution with a proper concentration, such as about 2.38%. In one embodiment, since the exposed regions of the resist layer 206 are soluble in the developer chemical, the plurality of resist features 206a may be formed in the upper portion of the resist layer 206 after the developing process. In the lower portion of the resist layer 206, the acid generated by PAG may be substantially neutralized by the quenchers or base materials 205 in the material layer 204. In one embodiment, the overall acid left in the lower portion of the resist layer 206 may be less than the amount of acid needed to remove the protecting groups. Therefore the lower portion of the resist layer 206 may become insoluble to the developer chemical. The insoluble lower portion of the resist layer 206 forms a resist remaining layer 206b. In one embodiment, the resist remaining layer 206b could be continuous. In one embodiment, the resist remaining layer 206b may continuously cover the upper surface of the material layer 204. In one embodiment, the resist remaining layer 206b is connected with the plurality of resist features 206a. In one embodiment, the resist patterns formed after the developing process include one or more resist features 206a and a resist remaining layer 206b.

In some embodiments, the resist remaining layer 206b has a proper thickness, so that the adhesion force between the resist remaining layer 206b and the material layer 204 is big enough to prevent the resist features from collapsing. In one embodiment, the resist remaining layer 206b has a proper thickness, so that the adhesion force between the resist features 206a and the resist remaining layer 206b is big enough to prevent the resist features from collapsing. In one embodiment, the thickness of the resist remaining layer 206b is also proper enough so that the resist remaining layer 206b may be removed during the following processes of the semiconductor device 200. In one embodiment, the resist remaining layer 206b has a thickness ranging from 10 to 2000 angstroms. The thickness of the resist remaining layer 206b may be controlled by adjusting the concentration of quenchers or base materials 205 distributed in the upper portion of the material layer 204. In one embodiment, the concentration of the quenchers may be adjusted by adding a proper amount of quenchers into the spin coating solution. In one embodiment, the concentration of quenchers or base materials 205 distributed in the upper portion of the material layer 204 may be adjusted by controlling the baking condition. For example the concentration of quenchers or base materials 205 distributed in the upper portion of the material layer 204 may be adjusted by changing baking temperature and/or baking time.

After developing the resist layer to form resist patterns, the resist patterns may be rinsed with DI water. The resist patterns may be further spun dried.

Figure 3:
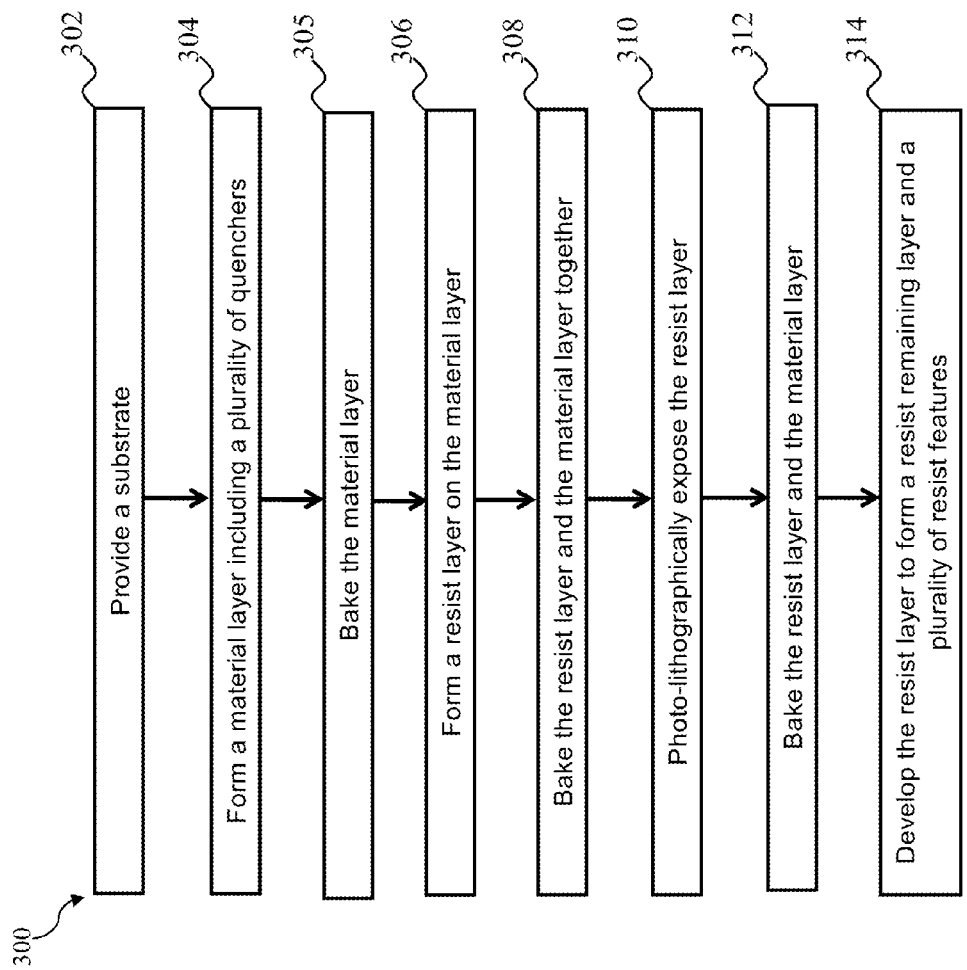
FIG. 3 is a flowchart of a method of forming resist patterns in one embodiment constructed according to some aspects of the present disclosure.

FIG. 3 provides a flowchart of a lithography method. The method 300 begins at step 302 by providing a substrate. The surface of the substrate may be cleaned, dehydrated and/or surface primed to provide a better adhesion.

The method 300 proceeds to step 304 by forming a material layer on the substrate. In one embodiment, the material layer may be formed by a spin coating technique. In one embodiment, the material layer may include an anti-reflective material. For example, the material layer may include an organic bottom anti-reflective coating (BARC) material. In one embodiment, a plurality of quenchers or base materials are added into the spin coating solution. The spin coating solution is then coated on the substrate to form a material layer. In one embodiment, the plurality of quenchers or base materials are distributed in the material layer. In one embodiment, the quenchers or base materials are capable of neutralizing acid.

In some examples, the material layer has a thickness ranging from about 10 to 1000 angstrom.

The material layer may include one or more layers. In some examples, the material layer may include a dielectric layer. In some examples, the dielectric layer may be formed using a suitable process such as an atomic layer deposition (ALD). Other methods to form the dielectric layer include metal organic chemical vapor deposition (MOCVD), physical vapor deposition (PVD), UV-Ozone Oxidation and molecular epitaxy beam (MEB) method. In one embodiment, the dielectric layer includes metal nitrides, metal silicates and/or metal oxides. In one embodiment, the material layer further includes a base quencher layer disposed on the dielectric layer. The base quencher layer may be formed using a spin coating technique.

The method 300 proceeds to step 305 by baking the material layer after the spin coating process. In one embodiment, the quenchers or base materials can migrate into the upper portion of the material layer during the baking process. In one embodiment, the baking process is conducted at a temperature ranging from about 30° C. to about 300° C. In one particular embodiment, the baking process is conducted at a temperature ranging from about 200° C. to about 250° C. In one embodiment, the baking process is performed for about 0.5 minutes to 300 minutes. In one embodiment, the baking process evaporates the solvent in the material layer. The quenchers or base materials in the material layer may migrate into an upper portion of the material layer during and/or after the baking process. In one embodiment, after the baking process, the quenchers or base materials may or may not be uniformly distributed in the material layer.

The method 300 proceeds to step 306 by forming a resist layer on the material layer. In one embodiment, the resist layer may be a photoresist layer. The resist layer may be formed using a spin coating technique. In one embodiment, the resist layer includes a CA resist material. In one embodiment, the resist layer also includes PAG material. In one embodiment, the resist layer may include an electron beam sensitive material. The electron beam sensitive material is patterned by an electron beam lithography process. The resist layer may have a thickness ranging from about 5 nm to about 3000 nm.

The method 300 may proceed to step 308 by baking the resist layer and the material layer. In one embodiment, the baking temperature is in the range of 30-300° C. In one particular embodiment, the baking process is conducted at a temperature ranging from about 200° C. to about 250° C. In one embodiment, the baking process is performed for about 5 minutes to 300 minutes. In one embodiment, the baking process evaporates the solvent in the resist layer. In one embodiment, the quenchers or base materials in the material layer can migrate into an upper portion of the material layer during and/or after the baking process. In one embodiment, after the baking process, the quenchers or base materials may or may not be uniformly distributed in the material layer.

The method 300 proceeds to step 310 by exposing the resist layer to a radiation. Although as shown in FIG. 3, the resist layer is exposed photo-lithographically, the radiation beam may be any other radiation source used in a lithography process. For example, the radiation beam may include ultraviolet (UV), deep ultraviolet (DUV) and/or extreme ultraviolet (EUV), such as a 248 nm beam from a Krypton Fluoride (KrF) excimer laser, or a 193 nm beam from an Argon Fluoride (ArF) excimer laser, etc. The radiation beam may be electron beam. In one embodiment, the resist layer may be exposed to the radiation using a reticle having a predefined pattern (or a reversed pattern). The lithography process may utilize other exposing modes or technologies, such as on-axis, off-axis, quadrupole, or dipole exposure technologies. The photolithography exposing process may also be implemented or replaced by other proper methods, such as maskless photolithography and electron beam lithography.

The method 300 may proceed to step 312 by baking the resist layer and the material layer after the exposing process. In one embodiment, the quenchers or base materials can migrate into an upper portion of the material layer. In one embodiment, the baking temperature is in the range of 30-300° C. In one embodiment, the baking process is conducted at a temperature ranging from 200 to 250° C. In one embodiment, the baking process is performed for about 5 minutes to 300 minutes.

The method 300 proceeds to step 314 by developing the resist layer using a developer chemical, such as TMAH solution, to form resist patterns. In one embodiment, the quenchers or base materials distributed in the upper portion of the material layer react with the acid generated in the lower portion of the resist layer. Therefore the lower portion of the resist layer becomes insoluble to the developer chemical. After the developing process, a resist remaining layer may be formed in the lower region of the resist layer. The upper portion of the resist layer exposed to the radiation becomes soluble to developer chemicals, thus a plurality of resist features may be formed. In one embodiment, the thickness of the resist remaining layer may be controlled by adjusting the amount of the quenchers or base materials added into the spin coating solution. In one embodiment, the thickness of the resist remaining layer may be adjusted by changing the baking condition in step 308 and/or step 312.

The method 300 may proceed to rinsing, drying, and/or other suitable processes. In one embodiment, the resist patterns, such as the resist remaining layer and the resist features, are rinsed with DI water and/or spin dried at a high rotation speed. The plurality of resist features may have a high aspect ratio. The resist patterns have superior adhesion to the material layer due to the large contact area between the resist remaining layer 206a and the material layer 204.

The resist patterns may be used as a masking element in performing one or more processes on underlying layers, such as etching, ion implantation, and/or other suitable processes.

The resist remaining layer 206b may be etched off during the following processes of the fabrication of the semiconductor device. In some embodiments, the resist patterns may be subsequently stripped from the substrate.

The lithography method may be combined with other processes. In an example, additives, such as fluorocarbon surfactant, may be added into the rinsing liquid. In another example, special rinsing materials, such as dried supercritical $CO_2$ may be used as the rinsing liquid.

Although not intended to be limiting, the present disclosure provides one or more advantages. For example, no additional process is required in the fabrication of the semiconductor device according to the present embodiment. The disclosed lithography process provides a higher repeatability and a simple method to demonstrate improved resist patterns with high aspect ratio. The process condition is flexible, for example, the disclosed lithography method may apply various types of resist materials. The disclosed lithography method may further combined with other chemicals or other process to form resist patterns on the substrate. The process window of the disclosed lithography process can be improved. The disclosed lithography method may be applied in the next generation lithographic process.

In summary, the present disclosure provides a method for forming resist patterns. The method includes providing a substrate; forming a material layer including a plurality of quenchers or base materials on the substrate; forming a resist layer on the material layer; exposing the resist layer; and developing the resist layer to form a resist remaining layer on an upper surface of the material layer, and a plurality of resist features on the resist remaining layer.

In some embodiments of the disclosed method, the forming the material layer includes adding the plurality of quenchers or base materials into a solution; and spin coating the solution on the substrate. The method may further include baking the material layer after spin coating the solution on the substrate. In one embodiment, the baking the material layer is conducted at a temperature in the range of 30-300° C.

In some embodiments of the disclosed method, the disclosed method may further include baking the resist layer and the material layer after forming the resist layer. In one embodiment, the baking the resist layer and the material layer is conducted at a temperature in the range of 30-300° C.

The plurality of quenchers or base materials may include N(R)3, where R includes one of H and an alkyl group having at least one carbon atom. R may further include a chemical unit selected from the group consisting of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si (OR*)3; —Si(R*)3; and/or epoxyl groups, where R* is selected from the group consisting of H, alkyl group, alkenyl group, and alkynyl groups.

The material layer may include an anti-reflective material. In one embodiment, the resist layer may include photo-acid generator (PAG) material, which is capable of generating acid. The plurality of quenchers or base materials may be distributed in an upper portion of the material layer, and may be capable of neutralizing the acid distributed in a lower portion of the resist layer. In one embodiment, the plurality of quenchers or base materials are distributed in the material layer with an increased quencher concentration in a vertical direction away from the substrate.

In some embodiments, the resist remaining layer is continuous. The resist remaining layer may be continuously covering the upper surface of the material layer.

In some embodiments, the exposing the resist layer includes exposing the resist layer to a UV beam, a DUV or an EUV. In another embodiment, the exposing the resist layer includes exposing the resist layer to an electron beam. The method may further include etching the resist remaining layer and the substrate that are uncovered by the plurality of resist features.

The present disclosure also provides a method for forming resist patterns. The method includes forming a material layer including a plurality of quenchers or base materials on a substrate; forming a resist layer on the material layer; baking the resist layer to have the plurality of the quenchers or base materials distributed in a top portion of the material layer such that the plurality of the quenchers or base materials are capable of substantially neutralizing acid generated in a bottom portion of the resist layer; exposing the resist layer; and developing the resist layer to form a resist remaining layer on an upper surface of the material layer, and a plurality of resist features on the resist remaining layer. The method may further include etching the resist remaining layer and the substrate that are uncovered by the plurality of resist features.

The present disclosure also provides a method for forming resist patterns. The method includes providing a substrate; forming a material layer over the substrate; forming a base quencher layer on the material layer; forming a resist layer on the base quencher layer; exposing the resist layer; and developing the resist layer to form a resist remaining layer on an upper surface of the material layer, and a plurality of resist features on the resist remaining layer. In one embodiment, the base quencher layer includes N(R)3, where R includes one of H and an alkyl group having at least one carbon atom.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming resist patterns comprising:
   providing a substrate;
   forming a material layer on the substrate, the material layer including a plurality of quenchers;
   forming a resist layer on the material layer;
   exposing the resist layer; and
   developing the resist layer to form a resist remaining layer on an upper surface of the material layer, and a plurality of resist features on the resist remaining layer,
   wherein the resist remaining layer is continuously covering the upper surface of the material layer prior to the material layer being etched.

2. The method of claim 1, wherein the forming the material layer includes:
   adding the plurality of quenchers into a solution; and
   spin coating the solution on the substrate.

3. The method of claim 2, further comprising:
   baking the material layer after spin coating the solution on the substrate.

4. The method of claim 3, wherein baking the material layer includes baking at a temperature in the range of 30-300° C.

5. The method of claim 1, wherein each of the plurality of quenchers comprises N(R)3, where R includes one of H and an alkyl group having at least one carbon atom.

6. The method of claim 5, wherein R includes a chemical unit selected from the group consisting of —Cl; —Br; —I; —NO2; —SO3-; —H—; —CN; —NCO; —OCN; —CO2-; —OH; —OR*; —OC(O)CR*; —SR, —SO2N(R*)2; —SO2R*; SOR; —OC(O)R*; —C(O)OR*; —C(O)R*; —Si (OR*)3; —Si(R*)3; and epoxyl groups, where R* is selected from the group consisting of H, alkyl group, alkenyl group, and alkynyl groups.

7. The method of claim 1, further comprising:
   baking the resist layer and the material layer after forming the resist layer.

8. The method of claim 7, wherein baking the resist layer and the material layer includes baking at a temperature in the range of 30-300° C.

9. The method of claim 1, wherein the resist layer includes photo-acid generator (PAG) material, capable of generating acid.

10. The method of claim 9, wherein the plurality of quenchers are distributed in an upper portion of the material layer, and capable of neutralizing the acid distributed in a lower portion of the resist layer.

11. The method of claim 1, wherein the plurality of quenchers are distributed in the material layer with an increased quencher concentration in a vertical direction away from the substrate.

12. The method of claim 1, wherein the exposing the resist layer includes exposing the resist layer to one of an ultraviolet (UV) beam, a deep ultraviolet beam, and an extreme ultraviolet beam.

13. The method of claim 1, wherein the exposing the resist layer includes exposing the resist layer to an electron beam.

14. The method of claim 1, wherein the material layer includes an anti-reflective material.

15. A method for forming resist patterns comprising:
forming a sheet of material layer on a substrate, the material layer including a plurality of quenchers;
forming a resist layer on the sheet of material layer;
baking the resist layer to have the plurality of the quenchers distributed in a top portion of the sheet of material layer such that the plurality of the quenchers are capable of substantially neutralizing acid generated in a bottom portion of the resist layer;
exposing the resist layer; and
developing the resist layer to form a resist pattern that includes the bottom portion of the resist layer on an upper surface of the sheet of material layer, and a plurality of resist features on the bottom portion of the resist layer,
wherein the bottom portion of the resist layer continuously covers the upper surface of the sheet of material layer.

16. The method of claim 15, further comprising:
etching the bottom portion of the resist layer and the substrate that are uncovered by the plurality of resist features.

17. A method for forming resist patterns comprising:
providing a substrate;
forming a material layer over the substrate;
forming a base quencher layer on the material layer;
forming a resist layer on the base quencher layer;
exposing the resist layer; and
developing the resist layer to form a plurality of resist features on the resist remaining layer and a plurality of spaces between the resist features, wherein the plurality of spaces includes a relatively thin portion of the resist layer.

18. The method of claim 17, wherein the base quencher layer includes N(R)3, where R includes one of H and an alkyl group having at least one carbon atom.

19. The method of claim 1, wherein the exposing of the resist layer is performed using a pattern of transparent and opaque features.

* * * * *